(12) United States Patent
Fjelstad et al.

(10) Patent No.: US 7,973,391 B2
(45) Date of Patent: Jul. 5, 2011

(54) TAPERED DIELECTRIC AND CONDUCTOR STRUCTURES AND APPLICATIONS THEREOF

(75) Inventors: Joseph C. Fjelstad, Maple Valley, WA (US); Kevin P. Grundy, Fremont, CA (US); Para K. Segaram, Brookfield (AU); Gary Yasumura, Santa Clara, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 398 days.

(21) Appl. No.: 12/128,620

(22) Filed: May 29, 2008

(65) Prior Publication Data

US 2009/0027137 A1    Jan. 29, 2009

Related U.S. Application Data

(62) Division of application No. 10/987,187, filed on Nov. 12, 2004, now Pat. No. 7,388,279.

(60) Provisional application No. 60/519,545, filed on Nov. 12, 2003.

(51) Int. Cl.
*H01L 23/58* (2006.01)

(52) U.S. Cl. ........ 257/638; 257/775; 257/737; 257/738; 257/E23.021; 257/E23.069; 257/E21.508

(58) Field of Classification Search .................. None
See application file for complete search history.

(56) References Cited

U.S. PATENT DOCUMENTS

| | | | |
|---|---|---|---|
| 2,825,876 A | 3/1958 | Merkel et al. | |
| 2,979,676 A | 4/1961 | Rueger | |
| 3,419,813 A | 12/1968 | Kamnitsis | |
| 4,048,589 A | 9/1977 | Knox et al. | |
| 4,072,902 A | 2/1978 | Knox et al. | |
| 4,125,810 A | 11/1978 | Pavio | |
| 4,467,345 A * | 8/1984 | Ozawa | 257/786 |
| 4,514,751 A * | 4/1985 | Bhattacharya | 257/737 |
| 4,654,692 A * | 3/1987 | Sakurai et al. | 257/775 |
| 4,680,610 A * | 7/1987 | Pammer | 257/737 |
| 4,697,143 A * | 9/1987 | Lockwood et al. | 324/754 |
| 4,745,377 A | 5/1988 | Stern et al. | |
| 4,806,886 A | 2/1989 | Stern et al. | |
| 4,827,211 A * | 5/1989 | Strid et al. | 324/754 |
| 4,862,120 A | 8/1989 | Ruxton et al. | |
| 4,894,612 A * | 1/1990 | Drake et al. | 324/754 |
| 4,991,001 A | 2/1991 | Takubo et al. | |
| 5,075,648 A | 12/1991 | Roberts et al. | |
| 5,101,261 A * | 3/1992 | Maeda | 257/734 |
| 5,107,231 A | 4/1992 | Knox | |
| 5,119,048 A | 6/1992 | Grunwell | |
| 5,140,288 A | 8/1992 | Grunwell | |
| 5,155,352 A | 10/1992 | Kim et al. | |
| 5,160,904 A * | 11/1992 | Babbitt et al. | 333/34 |
| 5,170,138 A | 12/1992 | Boberts et al. | |

(Continued)

FOREIGN PATENT DOCUMENTS

JP          62269349 A    11/1987

(Continued)

*Primary Examiner* — David E Graybill

(74) *Attorney, Agent, or Firm* — Myers Bigel Sibley & Sajovec, P.A.

(57) ABSTRACT

Disclosed are tapered dielectric and conductor structures which provide controlled impedance interconnection while signal conductor lines transition from finer pitches to coarser pitches thereby obviating electrical discontinuities generally associated with changes of circuit contact pitch. Also disclosed are methods for the construction of the devices and applications therefore.

11 Claims, 3 Drawing Sheets

U.S. PATENT DOCUMENTS

| | | | |
|---|---|---|---|
| 5,172,082 A | 12/1992 | Livingston et al. | |
| 5,173,666 A | 12/1992 | Babbitt et al. | |
| 5,177,456 A | 1/1993 | Stern et al. | |
| 5,200,719 A * | 4/1993 | Margulis et al. | 333/34 |
| 5,225,797 A | 7/1993 | Schary et al. | |
| 5,280,168 A | 1/1994 | Kim et al. | |
| 5,289,036 A * | 2/1994 | Nishimoto | 257/774 |
| 5,329,162 A * | 7/1994 | Nadaoka | 257/774 |
| 5,382,831 A * | 1/1995 | Atakov et al. | 257/767 |
| 5,461,260 A * | 10/1995 | Varker et al. | 257/773 |
| 5,470,788 A * | 11/1995 | Biery et al. | 438/648 |
| 5,576,671 A | 11/1996 | Agar et al. | |
| 5,672,889 A * | 9/1997 | Brown | 257/77 |
| 5,689,139 A * | 11/1997 | Bui et al. | 257/758 |
| 5,712,510 A * | 1/1998 | Bui et al. | 257/758 |
| 5,739,587 A * | 4/1998 | Sato | 257/758 |
| 5,760,476 A * | 6/1998 | Varker et al. | 257/767 |
| 5,818,315 A * | 10/1998 | Moongilan | 333/238 |
| 5,936,492 A | 8/1999 | Shingyoji et al. | |
| 5,969,421 A * | 10/1999 | Smooha | 257/758 |
| 6,023,100 A * | 2/2000 | Tao et al. | 257/762 |
| 6,043,556 A | 3/2000 | Tomie | |
| 6,081,036 A * | 6/2000 | Hirano et al. | 257/773 |
| 6,091,027 A | 7/2000 | Hesselbom et al. | |
| 6,100,853 A | 8/2000 | Schaffner et al. | |
| 6,127,987 A | 10/2000 | Maruyama et al. | |
| 6,169,326 B1 * | 1/2001 | Jun | 257/734 |
| 6,191,481 B1 * | 2/2001 | Bothra et al. | 257/734 |
| 6,198,284 B1 * | 3/2001 | Doty | 324/318 |
| 6,268,781 B1 | 7/2001 | Schaffner | |
| 6,331,806 B1 | 12/2001 | Shingyoji et al. | |
| 6,346,749 B1 * | 2/2002 | Umemura | 257/774 |
| 6,384,694 B1 | 5/2002 | Tanizaki et al. | |
| 6,388,269 B1 * | 5/2002 | Saito | 257/48 |
| 6,417,572 B1 * | 7/2002 | Chidambarrao et al. | 257/773 |
| 6,424,014 B2 * | 7/2002 | Sasaki et al. | 257/368 |
| 6,426,686 B1 * | 7/2002 | Douriet et al. | 333/247 |
| 6,479,765 B2 * | 11/2002 | Ramey et al. | 174/262 |
| 6,518,663 B1 | 2/2003 | James et al. | |
| 6,522,021 B2 * | 2/2003 | Sakihama et al. | 257/784 |
| 6,525,631 B1 | 2/2003 | Oldfield | 333/246 |
| 6,548,902 B2 * | 4/2003 | Suzuki et al. | 257/758 |
| 6,556,099 B2 * | 4/2003 | Khan et al. | 333/34 |
| 6,566,758 B1 * | 5/2003 | Trivedi et al. | 257/774 |
| 6,624,718 B2 * | 9/2003 | Mauritz et al. | 333/34 |
| 6,639,487 B1 | 10/2003 | Salmela et al. | |
| 6,660,174 B2 * | 12/2003 | Oldfield | 216/13 |
| 6,677,236 B2 * | 1/2004 | Umemura | 438/667 |
| 6,700,207 B2 * | 3/2004 | Pekin et al. | 257/778 |
| 6,737,931 B2 * | 5/2004 | Amparan et al. | 333/34 |
| 6,745,378 B2 * | 6/2004 | Anazawa | 716/10 |
| 6,856,709 B2 * | 2/2005 | Uesaka et al. | 385/2 |
| 6,876,085 B1 | 4/2005 | Handforth et al. | |
| 6,897,563 B2 * | 5/2005 | Bobba et al. | 257/774 |
| 6,940,108 B2 * | 9/2005 | Cheng et al. | 257/211 |
| 7,025,617 B2 * | 4/2006 | Regnier et al. | 439/329 |
| 7,065,721 B2 * | 6/2006 | Pekin et al. | 716/2 |
| 7,233,160 B2 * | 6/2007 | Hayden et al. | 324/762 |
| 7,239,028 B2 | 7/2007 | Anzai | |
| 7,348,865 B2 * | 3/2008 | Carvalho et al. | 333/33 |
| 2002/0017397 A1 | 2/2002 | Ramey et al. | |
| 2002/0075093 A1 | 6/2002 | Mauritz et al. | |
| 2002/0084876 A1 * | 7/2002 | Wright et al. | 333/238 |
| 2002/0089342 A1 * | 7/2002 | Khoury et al. | 324/754 |
| 2002/0089343 A1 * | 7/2002 | Khoury et al. | 324/754 |
| 2002/0097110 A1 | 7/2002 | Khan et al. | |
| 2003/0046647 A1 * | 3/2003 | Anazawa | 716/10 |
| 2003/0091258 A1 | 5/2003 | Uesaka et al. | |
| 2003/0092420 A1 | 5/2003 | Sugimoto et al. | |
| 2003/0098510 A1 * | 5/2003 | Trivedi et al. | 257/774 |
| 2003/0122258 A1 * | 7/2003 | Bobba et al. | 257/773 |
| 2003/0122259 A1 * | 7/2003 | Bobba et al. | 257/773 |
| 2003/0159262 A1 | 8/2003 | Pasternak et al. | |
| 2003/0168250 A1 | 9/2003 | Pasternak et al. | |
| 2003/0224632 A1 * | 12/2003 | Regnier et al. | 439/79 |
| 2004/0012458 A1 | 1/2004 | Amparan et al. | |
| 2004/0021232 A1 * | 2/2004 | Pekin et al. | 257/778 |
| 2004/0108592 A1 * | 6/2004 | Cheng et al. | 257/734 |
| 2004/0114868 A1 * | 6/2004 | Roberson | 385/43 |
| 2004/0119150 A1 * | 6/2004 | Hwang et al. | 257/686 |
| 2005/0017368 A1 * | 1/2005 | Mertol et al. | 257/773 |
| 2005/0058388 A1 | 3/2005 | Nomura et al. | |
| 2005/0099191 A1 * | 5/2005 | Gleason et al. | 324/754 |
| 2005/0173150 A1 | 8/2005 | Shiraki | |
| 2006/0226930 A1 | 10/2006 | Carvalho et al. | |
| 2009/0027137 A1 * | 1/2009 | Fjelstad et al. | 333/34 |

FOREIGN PATENT DOCUMENTS

| | | | |
|---|---|---|---|
| JP | 04116827 A | * | 4/1992 |
| WO | WO 9704495 A1 | | 2/1997 |

* cited by examiner

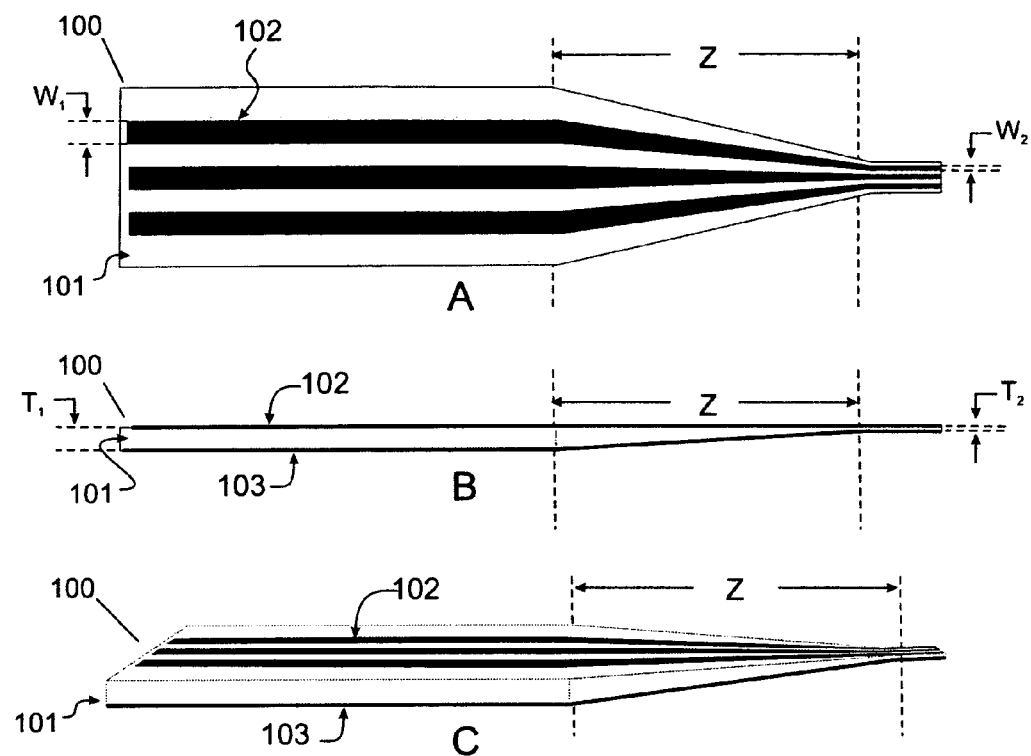
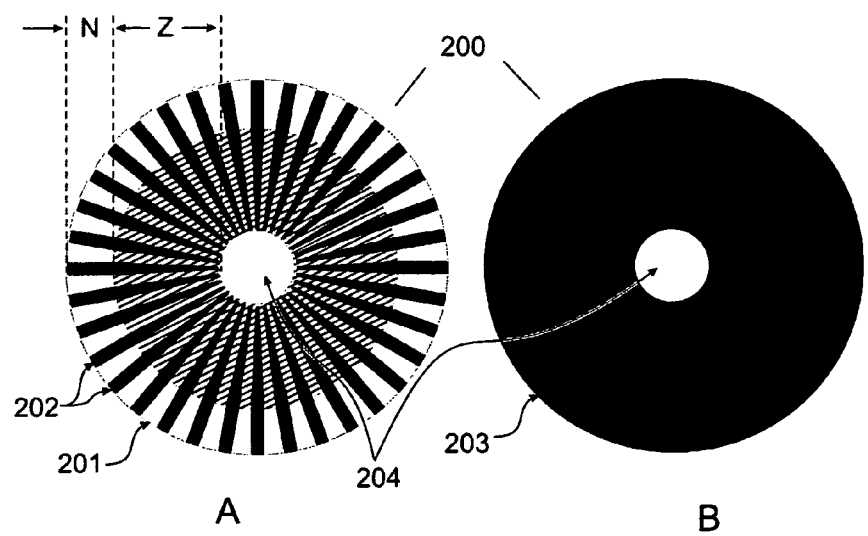
Figure 1
Figure 2

TAPERED DIELECTRIC AND CONDUCTOR STRUCTURES AND APPLICATIONS THEREOF

CROSS-REFERENCE TO RELATED APPLICATIONS

This application is a divisional application of, and hereby incorporates by reference, U.S. patent application Ser. No. 10/987,187, filed Nov. 12, 2004 now U.S. Pat. No. 7,388,279, which claims the benefit of Provisional Application No. 60/519,545, filed Nov. 12, 2003.

FIELD OF THE INVENTION

The present invention relates to the field of high speed electronic interconnections and the packaging of semiconductor integrated circuits for use therewith.

BACKGROUND

The overall performance of high speed electronic systems operating in the multi-gigabit per second range is ultimately dependant on the signal integrity of the transmitted data. The first steps in controlling signal integrity are made in the design of the circuit. Choices made in terms of circuit layout, the materials used and the general architecture of the complete assembly will all have impact on the quality of the transmitted electronic signal. One of the major concerns in maintaining signal integrity is to assure that the signal encounters as few parasitic effects and electrical discontinuities as possible. One solution would be to have all signals in an electronic system be made by means of coaxial cable connections to provide and maintain a fully shielded conductor path having unvarying characteristic impedance through its entire path. However, this solution is impractical and too expensive for most electronic products.

In place of coaxial cables, microstrip and stripline interconnection paths are constructed to control the impedance and provide a measure of shielding. While these solutions have worked well for the industry for some years, as the electronics industry transitions into the gigahertz frequency due to the continuing advance of semiconductors processing, the old methods must be either replaced with new ones or the old methods must be modified to accommodate the changes needed. This is especially true as signals from the IC chip start out at a very fine pitch (i.e. circuit or contact width and spacing) and must from there graduate to the coarser pitches required for next level assembly. These transitions are normally characterized by junctions that are abrupt as the signal moves from one part of the interconnection chain to the next and, depending on the speed of the signal, these transitions can have profound effects on the signal integrity, manifest in the form of reflections and ringing in the circuit. Thus as circuit speeds climb, there is need for new approaches to design of interconnections from the chip through the interconnection chain, which will provide relief from those current design features and elements that degrade circuit performance.

BRIEF DESCRIPTION OF THE DRAWINGS

The present invention is best illustrated by way of example, and not by way of limitation, in the figures of the accompanying drawings and in which like reference numerals refer to similar elements and in which:

FIG. 1A-C shows top (i.e. conductor circuit side), cross sectional and perspective views of a cable embodiment;

FIGS. 2A & B provides first and second side views (i.e. conductor circuit side and ground side) of a probe card embodiment;

DETAILED DESCRIPTION

Figure 3:
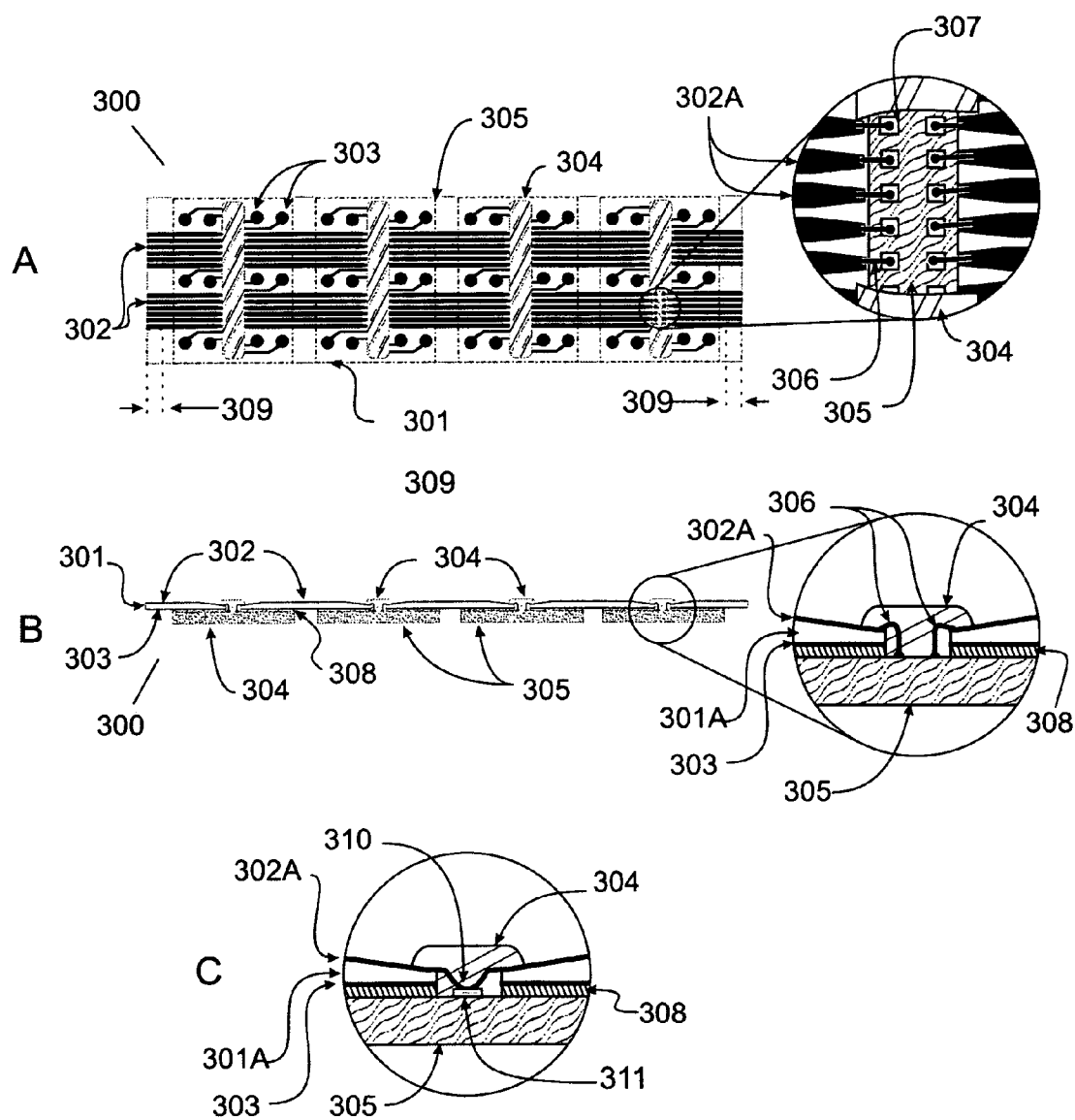
FIGS. 3A, B & C provides circuit side and cross sectional views of a strip of IC packages embodiment with enlarged areas of detail provided for clarity.

Disclosed herein are innovative structures for controlling the quality of an electronic signal that must transition from a fine pitch to a coarser, more useful pitch. An example is the pitch transition from IC chip to terminations on an IC package. Another example is pitch transition required from IC chip to an IC test system. The objective is accomplished by creating interconnection paths that simultaneously taper insulating substrate and signal line to effectively produce the desired characteristic impedance in the signal line in a manner that is unchanging as the signal transitions from a fine pitch to a coarser pitch. This structure is useful for a wide variety of applications from test and measurement to electronic system structures such as switches and routers to IC packages for a range of chips and applications from CPU chips to memory chips as well as for circuit structures that are used to interconnect them.

The embodiments herein disclosed address the limitations of current circumstances relative to the design and manufacturing practices employed in the fabrication of electronic device and system interconnections and the present inability of those design and manufacturing practices to address adequately and fully the needs for improved electronic signal integrity as it transitions from fine pitch to course pitch and back to fine pitch as required. Thus, a first objective of the present disclosure is to describe structures which provide uniform controlled impedance from one electronic device or element to another electronic device or element while the signal transitions from a fine pitch to a course pitch and back. It is a second objective of the disclosure to describe applications of the structures described in specific product embodiments where significant benefit or improvements in product performance can be gained. It is a third objective of this disclosure to describe prospective methods for the construction of tapered dielectric and tapered trace structures that provide a uniform characteristic impedance as traces transition from fine to coarse pitch.

The present embodiments offer novel alternative approaches to addressing and meeting the stated objective and solving the problems associated with current design approaches. The conceptual structures comprise the use of any of a number of alternative embodiments of controlled impedance signal distribution structures from one device or element to a second device or element while the pitch (i.e. width and spacing) of the conductor is reduced or enlarged.

In FIGS. 1A, B and C is shown an embodiment that accomplishes the objective of maintaining uniform characteristic impedance by simultaneously tapering, or incrementally stepping, both trace and dielectric in a common region. In FIG. 1A a top view of a circuit section 100 having a insulating dielectric base 101, which is desirably uniform in terms of its electrical properties (e.g., dielectric constant and loss tangent) and has conductors 102 disposed on its surface. The individual circuit traces have different widths, $W_1$ and $W_2$, at their distal ends, with the width of the traces being reduced as the circuit traces transition through a tapering zone Z. The width of dielectric is shown being also reduced in the illustration but this is not a requirement. Continuing, FIG. 1B shows a cross sectional view of 1B wherein the circuit traces 102 are disposed on the first surface and a ground layer 103 resides on the side opposite the circuit traces separated by an insulating dielectric material 101. The dielectric material is shown having two different thicknesses $T_1$ and $T_2$, at the distal ends and a zone Z that is tapered in the same region where the insulating dielectric material is tapered to create the effect of uniform characteristic impedance as the circuit trace width and pitch is reduced. FIG. 1C provides a perspective view of the circuit section and the elements of structure in a more clarified form. While this represents a preferred embodiment, the objectives can be also be accomplished by keeping the dielectric thickness constant and, in lieu of tapering the dielectric, having the ground metal layer become more physically diffuse with expanding open area to incrementally control capacitance as the circuit width expands. (i.e. having more or greater openings in the metal ground as the circuit on the opposite side transitions from lesser to greater width) The objective could likewise be accomplished by having the dielectric become more diffuse (e.g. providing a filigree or sieve-like perforated embodiment of the metal ground) to create a gradient dielectric constant in the material that trends from the relative dielectric constant value of the material toward a value of 1.

Such tapered structures could be created by molding of the dielectric followed by the creation of the conductor traces or, alternatively the dielectric material could be molded over the circuits on a second material. Another alternative manufacturing method is to form the taper structure by deposition of the dielectric, such as by means of multiple layers of prefabricated or multiple layers of sequentially screen printed dielectric materials or by means of ink jet printing thin layers of dielectric materials onto a metal base to create the desired dielectric taper topography for the circuits.

FIG. 2A provides an illustration of a first side of an embodiment useful for high speed testing, such as a high speed probe card 200. In the figure, circuit traces, having straight and tapered portions along their length 202, are disposed on a dielectric material 201, which has an aperture in the center 204 for accessing a device under test. The outer portion of the circular probe card, zone N, has a constant dielectric thickness and trace width in this area is also constant. Both circuit width and dielectric thickness diminish in zone Z to provide uniform characteristic impedance along their length. FIG. 2B provides a view of the reverse side of the probe card revealing a full ground layer with a central aperture 204.

FIGS. 3A & B provide circuit side and cross sectional views of a multi-chip package strip embodiment, such as might be used in a memory module application. FIG. 3C provides an enlarged view of an alternative structure and method of interconnection to the IC die. While the structure is shown as a multi-chip structure, it is clear that a single individual IC die could also be packaged with the attributes of those IC die within the packaged strip as shown.

FIG. 3A provides a circuit side view of a packaged strip 300, having IC chips 305 (shown in phantom outline as they are located on the back side) in any practical number. The strip is comprised of an insulating base material 301 that has disposed on its surface parallel circuit traces 302 for critical signal transmission and discrete terminations 303, used for connection to power, ground and non critical signal terminations on a next level assembly (the next level assembly is not shown in this figure). The ends of the strip package 309 are used for termination to the next level assembly. An enlarged view of the terminations with encapsulant 304 removed reveals wires 306 bonded to both bond pads 307 on the chip 305 and the tapered ends of the circuit traces 302A.

FIG. 3B provides a cross section view of FIG. 3A wherein the packaged strip 300 is shown on edge to provide more detail. The insulating dielectric base material 301 has circuits 302 disposed on one side and a ground layer 303 on the second side. IC chips 305 are bonded to the base material with its circuits and ground plane by means of an adhesive 308 and interconnections between the chip 305 and the circuits 302 is accomplished by wire bonds 306 and then protected with an encapsulant 304. An enlarged view of a section of the assembly provides greater detail for clarity and shows a section of the material that is tapered 301A beneath the tapered traces.

While the structures are shown with wire bonds being made to two rows of bond pads, the structure is not so limited and could also be created using a single bond pad in the center or at the edges of the IC chip. For a center bond pad structure as illustrated in FIG. 3C, a common lead 310 could be down bonded or soldered to the central bond 311 pad and be unbroken. Moreover, the tapering structure could also fan away from a peripherally leaded device in a manner similar to current BGA or QFP IC packages.

Figure 4:
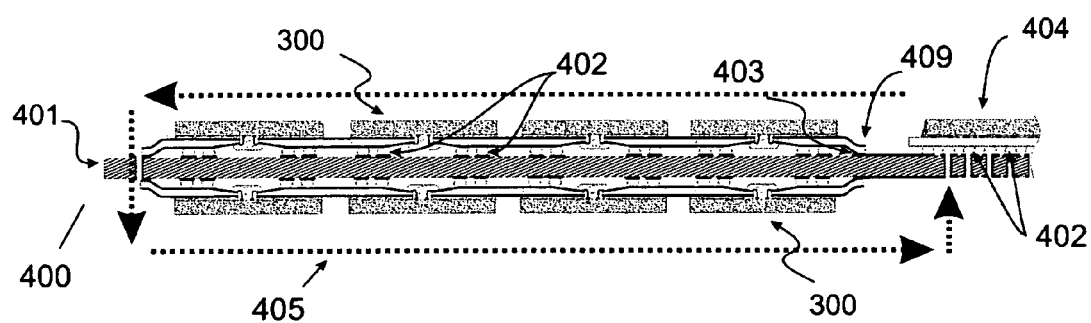
FIG. 4 provides a cross sectional view of an embodiment comprising strips of IC packages mounted to opposite sides of a section of next level interconnection substrate and illustrating, with dotted lines, a prospective flow of the signal.

FIG. 4 illustrates a partial view of module embodiment 400 wherein package strips 300 are mounted to an interconnecting substrate 401 having interconnection vias, such as a memory module, as partially shown. In the figure, a memory controller/buffer chip 404 is interconnected to the interconnecting substrate 401 with solder balls 402 or other suitable interconnecting connecting medium. Solder balls or other interconnecting medium are also used to interconnect the package strips 300 to the interconnecting substrate 401. Additional lapped interconnections 403 are made between the packaging strip and the interconnecting substrate at the ends 409 by a suitable method such as soldering or by use of a conductive adhesive. In the figure is also shown a prospective routing path for the critical or high speed signals represented by the dotted line arrows 409. While not shown in the drawing, it is evident that the strip packages could be stacked to increase memory density as well as speed if the I/O terminations for non-critical signals were moved to the gap between the chips while the ends are connected to a bus that controls their passage from different layers of packaged strips.

FIGS. 5A and B illustrate other embodiments wherein more than one layer of tapered circuits (taper of circuit widths not shown) are stacked to increase local contact density. In FIG. 5A is shown an embodiment of a multilayer circuit structure having tapered dielectric 500A. In the figure, layers of insulation material 501 are interleaved with conductor signal layers 502 and ground layers 503. The insulation tapers to a reduced thickness in zone Z and the signals egress from the substrate to be accessed for interconnection to mating elements in a stair step fashion at the ends 504A and 504C which are accessed on the same side of the structure.

In FIG. 5B is shown another embodiment of a multilayer circuit structure having tapered dielectric 500B. In the figure, layers of insulation material 501 are interleaved with conductor signal layers 502 and ground layers 503. The insulation tapers to a reduced thickness in the zone Z and the signals egress from the substrate to be accessed for interconnection to mating elements in a stair step fashion at the ends 504B and 504C which are accessed on opposite sides of the structure.

Figure 5:
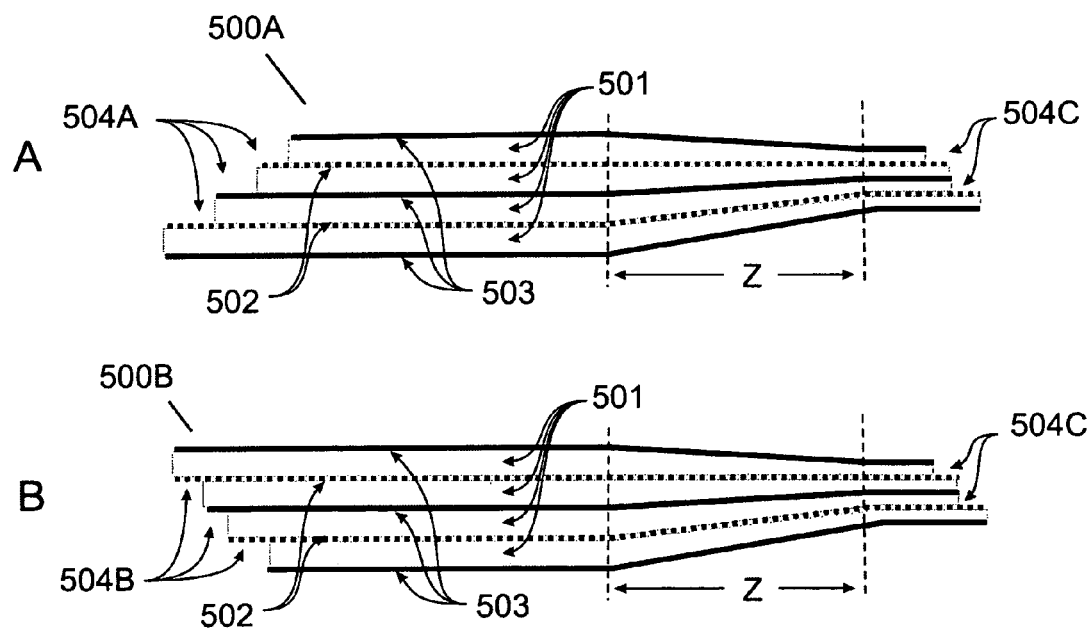
FIGS. 5A & B provides cross sectional views of embodiments that provide access to more than one layer of circuits within a structure.

While the structures in FIG. 5 indicate only two conductor signal lines routed in a straight line, it is clear based on the other structures disclosed in this document that many signal lines and many physical configurations (e.g. round, rectangular, triangular, etc.) and that many different step configurations accessing different conductors at different layers are possible. It is also possible within the embodiments shown to integrate, when desired or advantageous, various active and passive electronic elements to enhance or further improve the performance of a system employing the invention. Finally, it is clear that the benefits of the tapered conductor and dielectric and like structures which provide a consistent value of characteristic impedance as signal lines transition from wide to narrow are suitable as interconnection substrates for the assembly of components.

Although the invention has been described briefly with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An electronic interconnection structure to provide a controlled characteristic impedance for signal conductors that converge from a coarser pitch to a finer pitch comprising:
    a dielectric layer having first and second surfaces;
    first and second signal paths on the first surface of the dielectric layer the first and second signal paths extending through a tapering region to a convergence area, a width of each of the first and second signal paths being tapered to a progressively narrower width through the tapering region toward the convergence area and being adjacent a width of the dielectric layer, a thickness of the dielectric layer progressively tapering through the tapering region toward the convergence area.

2. The electronic interconnection structure of claim 1, wherein the dielectric layer comprises a portion between the first and second signal paths.

3. The electronic interconnection structure of claim 2 wherein the width of the dielectric layer tapers to a progressively narrower width through the tapering region toward the convergence area.

4. The electronic interconnection structure of claim 1 wherein at least a portion of the convergence area is an aperture.

5. The electronic interconnection structure of claim 1 wherein the first signal paths are integral to an integrated circuit package.

6. The electronic interconnection structure of claim 1 wherein a rate at which the thickness of the dielectric layer tapers through the tapering region is proportional to a rate at which the width of each of the first and second signal paths narrows through the tapering region toward the convergence area.

7. The electronic interconnection structure of claim 1 further comprising a ground metal layer on the second surface of the dielectric layer.

8. The electronic interconnection structure of claim 7 wherein the ground metal layer becomes progressively diffuse through the tapering region toward the convergence area.

9. The electronic interconnection structure of claim 8 wherein a rate at which the ground metal layer becomes progressively diffuse through the tapering region is proportional to a rate at which the width of the signal paths narrow.

10. The electronic interconnection structure of claim 1, wherein the thickness of the dielectric layer is perpendicular to the width of the dielectric layer.

11. The electronic interconnection structure of claim 10, wherein the thickness of the dielectric layer is perpendicular to the first and second surfaces of the dielectric layer.

* * * * *